United States Patent
Zhang et al.

(10) Patent No.: US 11,614,324 B2
(45) Date of Patent: Mar. 28, 2023

(54) NON-DESTRUCTIVE BOND LINE THICKNESS MEASUREMENT OF THERMAL INTERFACE MATERIAL ON SILICON PACKAGES

(71) Applicant: INTERNATIONAL BUSINESS MACHINES CORPORATION, Armonk, NY (US)

(72) Inventors: Hongqing Zhang, Hopewell Junction, NY (US); Jay A. Bunt, Esopus, NY (US); David J. Lewison, LaGrangeville, NY (US); Joyce Molinelli Acocella, Poughquag, NY (US); Yu Luo, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 534 days.

(21) Appl. No.: 16/662,158

(22) Filed: Oct. 24, 2019

(65) Prior Publication Data
US 2021/0123729 A1     Apr. 29, 2021

(51) Int. Cl.
*H01L 21/02* (2006.01)
*G01B 15/02* (2006.01)
(Continued)

(52) U.S. Cl.
CPC ...... *G01B 15/025* (2013.01); *H01L 21/02057* (2013.01); *H01L 21/02631* (2013.01); *H01L 21/50* (2013.01); *H01L 22/12* (2013.01)

(58) Field of Classification Search
CPC ............ G01B 15/025; H01L 21/02057; H01L 21/02631; H01L 21/50; H01L 22/12; H01L 23/42; H01L 23/3675
See application file for complete search history.

(56) References Cited

U.S. PATENT DOCUMENTS

| 5,418,830 | A | 5/1995 | Florent |
| 6,252,930 | B1 | 6/2001 | Mackenzie et al. |

(Continued)

FOREIGN PATENT DOCUMENTS

| CN | 106959313 | A | 7/2017 |
| JP | H05223757 | A | 8/1993 |
| JP | 6171940 | B2 | 8/2017 |

OTHER PUBLICATIONS

S. T. Wang, "In-line automated inspection for semiconductor assembly," IEEE/SEMI Advanced Semiconductor Manufacturing Conference, pp. 127-134. (Year: 1992).*

*Primary Examiner* — Kiho Kim
(74) *Attorney, Agent, or Firm* — Cantor Colburn LLP; Tihon Poltavets

(57) ABSTRACT

Aspects of the invention include a non-destructive bond line thickness measurement of thermal interface material on silicon packages. A non-limiting example computer-implemented method includes receiving a chip mounted on a laminate and depositing a high-density material on the chip. The computer-implemented method deposits a thermal interface material on the chip and lids the chip, and the laminate with a lid. The computer-implemented method X-rays the lid, the chip, and the laminate to produce an X-ray and measures, using a processor, from the X-ray a bond line thickness of the TIM as a distance from a bottom of the lid to a top surface of the high-density material.

12 Claims, 4 Drawing Sheets

(51) Int. Cl.
*H01L 21/50* (2006.01)
*H01L 21/66* (2006.01)

(56) References Cited

U.S. PATENT DOCUMENTS

| 9,449,781 | B2 | 9/2016 | Yun et al. | |
| 9,594,036 | B2 | 3/2017 | Yun et al. | |
| 2008/0150128 | A1* | 6/2008 | Hung | H01L 23/36 |
| | | | | 257/E23.101 |
| 2009/0179322 | A1* | 7/2009 | Furman | H01L 23/3737 |
| | | | | 438/118 |
| 2011/0272692 | A1* | 11/2011 | Han | H01L 25/18 |
| | | | | 257/E23.179 |

* cited by examiner

110

NON-DESTRUCTIVE BOND LINE THICKNESS MEASUREMENT OF THERMAL INTERFACE MATERIAL ON SILICON PACKAGES

BACKGROUND

The present invention generally relates semiconductor packaging, and more specifically, to non-destructive bond line thickness measurement of thermal interface material on silicon packages.

During packaging of a semiconductor chip, thermal interface material ("TIM") is used. TIM is an important component for semiconductor cooling solutions. The control of TIM bond line thickness ("BLT") is therefore important for high thermal conducting performance. Measurement of TIM bond thickness can be performed by destructive techniques or non-destructive techniques.

SUMMARY

Embodiments of the present invention are directed to non-destructive bond line thickness measurement of thermal interface material on silicon packages. A non-limiting example computer-implemented method includes receiving a chip mounted on a laminate and depositing a high-density material on the chip. The computer-implemented method deposits a thermal interface material ("TIM") on the chip, and lids the chip and the laminate with a lid. The computer-implemented method X-rays the lid, the chip, and the laminate to produce an X-ray and measures, using a processor, from the X-ray a bond line thickness of the TIM as a distance from a bottom of the lid to a top surface of the high-density material.

Other embodiments of the present invention implement features of the above-described method in computer systems and methods.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
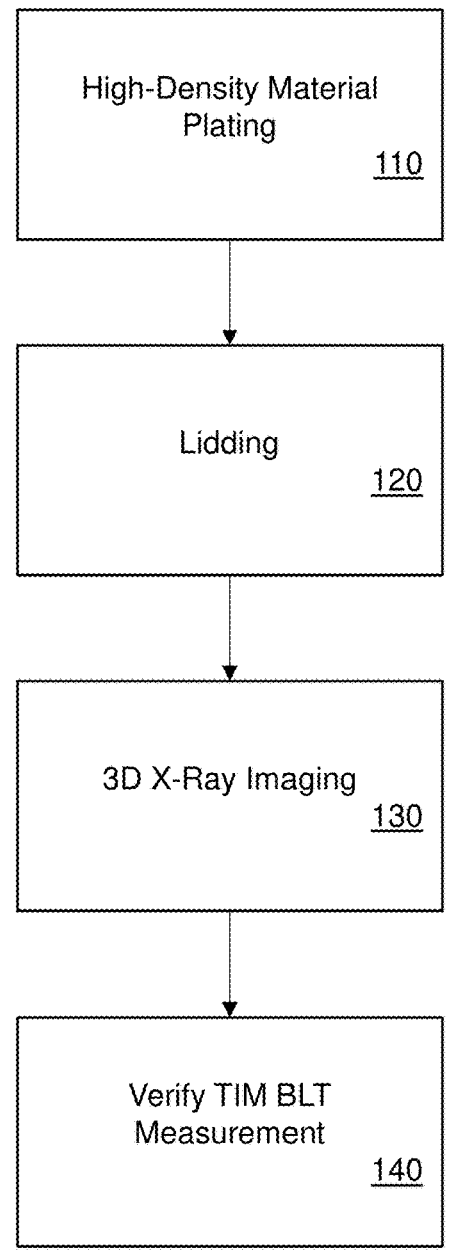
FIG. 1 illustrates a flowchart of an accurate non-destructive measuring process in accordance with one or more embodiments of the present invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiments of the present invention provide methods and systems for accurate measurement of thermal interface material ("TIM") bond line thickness ("BLT") measurement using non-destructive imaging. In order to overcome a main shortcoming of existing systems which is the difficulty in measuring bond line thickness due to contrast similarities, a coating of high-density material, such as gold, with well-defined thickness is applied to a chip prior to capping. The high-density material acts to improve X-ray mass contrast, which enables measurement of TIM BLT using 3D X-ray imaging.

3-D X-ray imaging uses X-rays to measure the thickness of a material. Incident X-rays hit the material and transmitted X-rays pass through the material. The formula below provides for a measurement of the thickness of the material or absorber:

$$I/Io = e^{-\mu^* x} = 1/e^{\mu^* x} = 1/e^{\mu \rho x}, \text{ where:}$$

I=transmitted X-rays intensity;
Io=incoming X-rays intensity;
x=absorber thickness;
$\mu^* = \mu\rho$=linear attenuation coefficient;
$\mu$=mass attenuation coefficient; and
$\rho$=density of absorber.

Current methods of TIM BLT measurement require either removing the lids or physical cross section, both of which are destructive methods. In addition, these destructive methods are prone to inaccurate measurement and damage due to sample preparation artifacts.

Typical non-destructive techniques include Conformal Scanning Acoustic Microscopy ("CSAM") imaging and 3D X-ray imaging. TIM BLT measurement using CSAM imaging is not practical due to characteristic warpage of the silicon chip and very thin gap present. 3D X-ray imaging alone is not practical due to the high transmission rate of X-rays through Si materials and TIM materials, giving poor mass contrast that is insufficient for BLT measurement.

In destructive techniques that involve removing the lid, i.e., unlidding, TIM BLT can be estimated after removing the lid, but it is destructive and not particularly accurate. A physical cross section can also be taken, but, that is destructive, sample preparation induces artifacts, and the data is not accurate.

One or more embodiments of the present invention address one or more of the above-described shortcomings of the prior art by providing for non-destructive measurement using 3-D X-rays in conjunction with the application of a coating of a high-density material, such as gold, prior to capping. The high-density material acts to significantly improve the X-ray mass contrast to enable accurate measurement of TIM BLT. The high-density material has a high contrast with the organic material present in the TIM, making it easy to take the TIM BLT measurement.

One or more embodiments of the present invention provide a non-destructive way to measure TIM BLT. It also provides for a high throughput of TIM BLT thickness measurement. The process can be utilized in a packaging environment, either development or manufacturing, without changing the performance of the silicon packaging. No modification of other processes is needed.

In addition, turn-around time for TIM BLT measurement is reduced from two days to approximately two hours. Artifacts are eliminated that would be induced in preparation of a physical test sample. Data accuracy is improved and costs are reduced.

Figure 4:
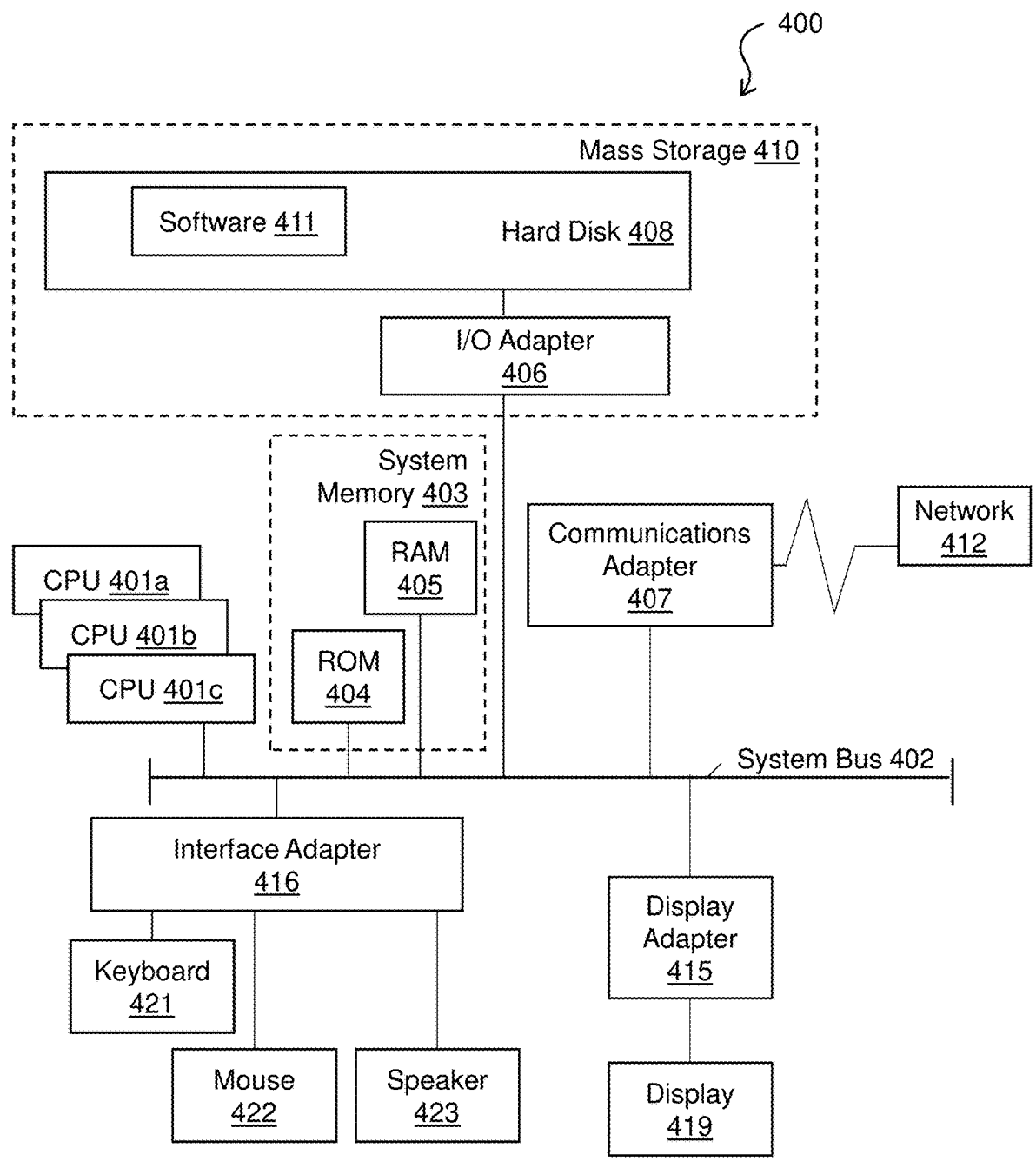
FIG. 4 illustrates a computer system environment in accordance with one or more embodiments of the present invention.

Turning now to FIG. 1, a flowchart of an accurate non-destructive measuring process 100 that can be performed using a processor as shown in FIG. 4 below is generally shown in accordance with one or more embodiments of the present invention. The silicon chip has a high-density material, such as gold, lead, or bismuth, for example, electroplated upon it (block 110). In one embodiment, the electroplating may occur at five spots on the chip: the four corners and the center of the chip. Those skilled in the art after reading this disclosure will understand that other configurations of electroplating could also be used. For example, electroplating in nine spots can be used, or electroplating a single sheet across the chip may be using. The electroplating may be to a thickness of about 5 micrometers for example. In an alternative embodiment, a thin sheet of metal layer with high mass density may be used in place of electroplating.

A lidding process is then performed which applies the TIM and places a metal lid on the silicon package (block 120). Further details of the lidding process are shown with respect to FIG. 2. Following lidding, a 3-D X-ray image is taken of the lidded chip package (block 130). Both the metal lid and high-density metal coating can be detected and imaged under 3-D X-rays. This enables measurement of a distance from a bottom of the lid to the top of the high-density material, which is the TIM BLT. Optionally, a physical cross-section can be taken, but need not necessarily be taken, to verify the TIM BLT measurement (block 140).

Figure 2A:
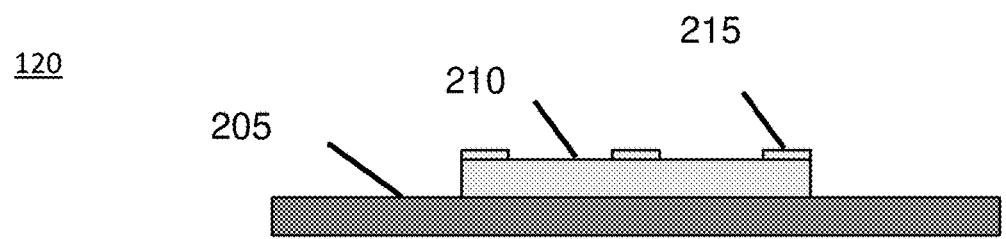
FIGS. 2a-2d illustrates a lidding process in accordance with one or more embodiments of the present invention.
Figure 2B:
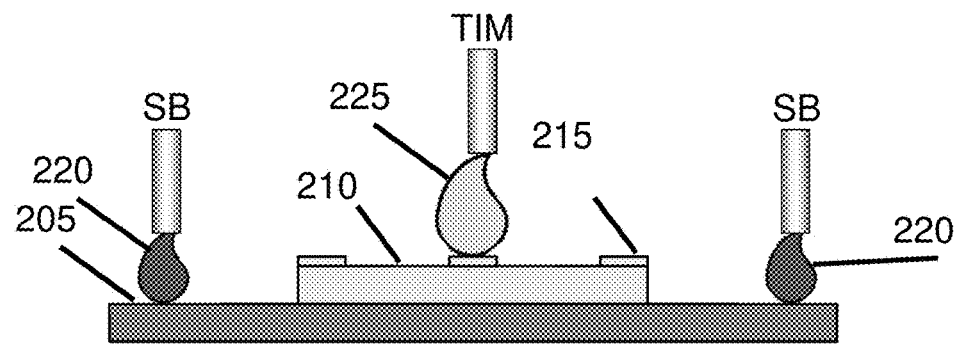
Figure 2C:
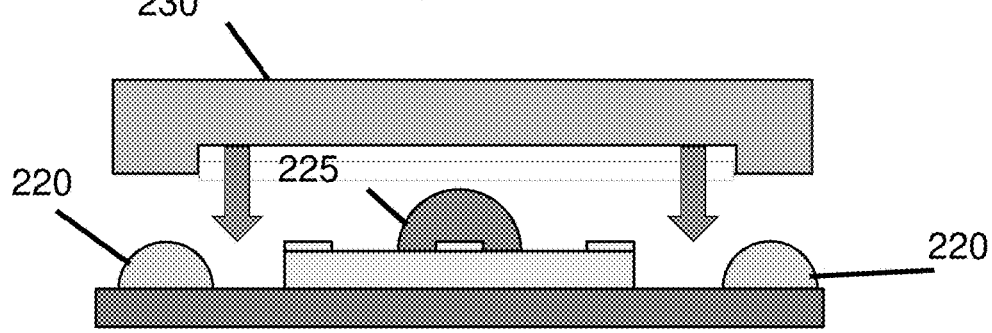
Figure 2D:
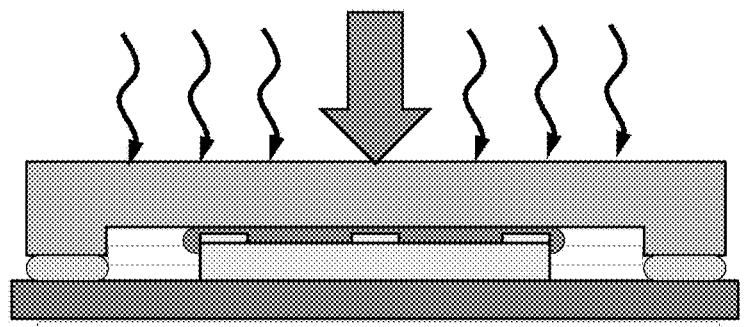

FIGS. 2a-2d illustrates the lidding process 120 of FIG. 1 in accordance with one or more embodiments of the present invention. A silicon die 210 is placed on a laminate 205. Plated "islands" 215 applied in the electroplating process are seen on the silicon die 210. In FIG. 2b, a thermal interface material 225 is placed on the silicon die 210 along with a sealband 220. In FIG. 2c a copper lid 230 is placed upon the silicon die 210 and laminate 205 (which form a module) and pressed on. In FIG. 2d. the module is placed in a furnace with a load on the copper lid 230 and allowed to cure. Curing time and temperature are dependent upon the sealband and thermal interface material that is used in the process.

Figure 3:
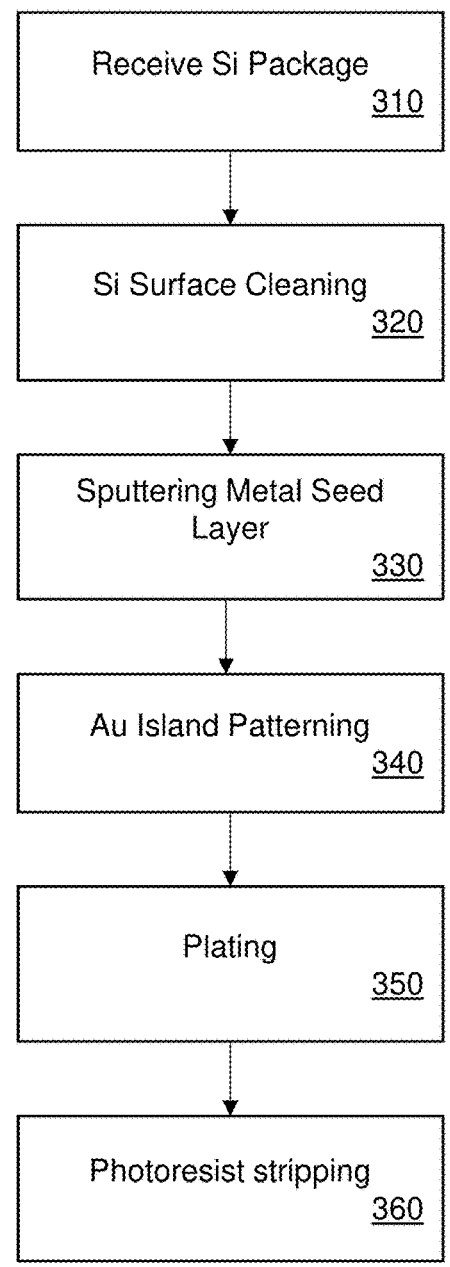
FIG. 3 illustrates an electroplating process in accordance with one or more embodiments of the present invention.

FIG. 3 illustrates the electroplating process 110 of FIG. 1 in accordance with one or more embodiments of the present invention. The silicon package is received with a silicon on substrate module level package in place prior to lidding (block 310). The silicon surface is cleaned (block 320). Cleaning can be performed by a standard brush-cleaning and oxygen ashing process. A metal seed layer, e.g., (300 ATi and 2000 A Cu), is sputtered onto the silicon chip (block 330). The islands are patterned with a negative photoresist for plating using a chrome or mylar mask, for example (block 340). A high-density material, such as gold, is plated through the patterned photoresist, with one to five micrometers of gold plated (block 350). The photoresist is stripped and metal seed etched away (block 360).

Under high energy X-rays (>100 kilovolts), material with a high-density material such as metal (Cu, Ni, Sn, Au) will show contrast among low density materials such as organic materials. The TIM materials contain an organic matrix that will induce good contrast with the high-density material, typically gold, and the lid, typically copper. The X-ray imaging and measurement of the gap between the lid and the high-density material, such as gold, enables the measurement of the dimension.

Turning now to FIG. 4, a computer system 400 is generally shown in accordance with an embodiment. The computer system 400 can be an electronic, computer framework comprising and/or employing any number and combination of computing devices and networks utilizing various communication technologies, as described herein. The computer system 400 can be easily scalable, extensible, and modular, with the ability to change to different services or reconfigure some features independently of others. The computer system 400 may be, for example, a server, desktop computer, laptop computer, tablet computer, or smartphone. In some examples, computer system 400 may be a cloud computing node. Computer system 400 may be described in the general context of computer system executable instructions, such as program modules, being executed by a computer system. Generally, program modules may include routines, programs, objects, components, logic, data structures, and so on that perform particular tasks or implement particular abstract data types. Computer system 400 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 4, the computer system 400 has one or more central processing units (CPU(s)) 401a, 401b, 401c, etc. (collectively or generically referred to as processor(s) 401). The processors 401 can be a single-core processor, multi-core processor, computing cluster, or any number of other configurations. The processors 401, also referred to as processing circuits, are coupled via a system bus 402 to a system memory 403 and various other components. The system memory 403 can include a read only memory (ROM) 404 and a random access memory (RAM) 405. The ROM 404 is coupled to the system bus 402 and may include a basic input/output system (BIOS), which controls certain basic functions of the computer system 400. The RAM is read-write memory coupled to the system bus 402 for use by the processors 401. The system memory 403 provides temporary memory space for operations of said instructions during operation. The system memory 403 can include random access memory (RAM), read only memory, flash memory, or any other suitable memory systems.

The computer system 400 comprises an input/output (I/O) adapter 406 and a communications adapter 407 coupled to the system bus 402. The I/O adapter 406 may be a small computer system interface (SCSI) adapter that communicates with a hard disk 408 and/or any other similar component. The I/O adapter 406 and the hard disk 408 are collectively referred to herein as a mass storage 410.

Software 411 for execution on the computer system 400 may be stored in the mass storage 410. The mass storage 410 is an example of a tangible storage medium readable by the processors 401, where the software 411 is stored as instructions for execution by the processors 401 to cause the computer system 400 to operate, such as is described herein below with respect to the various Figures. Examples of computer program product and the execution of such instruction is discussed herein in more detail. The communications adapter 407 interconnects the system bus 402 with a network 412, which may be an outside network, enabling the computer system 400 to communicate with other such systems. In one embodiment, a portion of the system memory 403 and the mass storage 410 collectively store an operating system, which may be any appropriate operating system, such as the z/OS or AIX operating system from IBM Corporation, to coordinate the functions of the various components shown in FIG. 4.

Additional input/output devices are shown as connected to the system bus 402 via a display adapter 415 and an interface adapter 416 and. In one embodiment, the adapters 404, 407, 415, and 416 may be connected to one or more I/O buses that are connected to the system bus 402 via an intermediate bus bridge (not shown). A display 419 (e.g., a screen or a display monitor) is connected to the system bus 402 by a display adapter 415, which may include a graphics controller to improve the performance of graphics intensive applications and a video controller. A keyboard 421, a mouse 422, a speaker 423, etc. can be interconnected to the system bus 402 via the interface adapter 416, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI). Thus, as configured in FIG. 4, the computer system 400 includes processing capability in the form of the processors 401, and, storage capability including the system memory 403 and the mass storage 410, input means such as the keyboard 421 and the mouse 422, and output capability including the speaker 423 and the display 419.

In some embodiments, the communications adapter 407 can transmit data using any suitable interface or protocol, such as the internet small computer system interface, among others. The network 412 may be a cellular network, a radio network, a wide area network (WAN), a local area network (LAN), or the Internet, among others. An external computing device may connect to the computer system 400 through the network 412. In some examples, an external computing device may be an external webserver or a cloud computing node.

It is to be understood that the block diagram of FIG. 4 is not intended to indicate that the computer system 400 is to include all of the components shown in FIG. 4. Rather, the computer system 400 can include any appropriate fewer or additional components not illustrated in FIG. 4 (e.g., additional memory components, embedded controllers, modules, additional network interfaces, etc.). Further, the embodiments described herein with respect to computer system 400 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
   receiving a chip mounted on a laminate;
   depositing one or more islands on a surface of the chip, each island comprising a high-density material, the high-density material comprising a metal having a thickness of one to five microns;
   depositing a thermal interface material ("TIM") on the surface of the chip and on a surface of each respective island, the TIM comprising an organic matrix comprising nonmetals;
   lidding the chip and the laminate with a lid;
   X-raying the lid, the chip, and the laminate to produce an X-ray; and
   indirectly measuring, using a processor, from the X-ray, a bond line thickness ("BLT") of the TIM as a distance from a bottom of the lid to a top surface of the high-density material by using an X-ray contrast between the metal of the high-density material and the nonmetals of the organic matrix.

2. The computer-implemented method of claim 1, wherein the high-density material is a material with sufficiently high mass density as to be detectable by X-rays.

3. The computer-implemented method of claim 1, wherein the high-density material is applied to a plurality of points on the chip.

4. The computer-implemented method of claim 1, wherein depositing a high-density material comprises cleaning a surface of the chip.

5. The computer-implemented method of claim 4, wherein depositing a high-density material comprises sputtering a metal seed layer on the surface of the chip.

6. A system comprising:
   a memory having non-transitory computer readable instructions; and
   one or more processors for executing the computer readable instructions, the computer readable instructions controlling the one or more processors to perform operations comprising:
      receiving a chip mounted on a laminate;
      depositing one or more islands on a surface of the chip, each island comprising a high-density material, the high-density material comprising a metal having a thickness of one to five microns;
      depositing a thermal interface material ("TIM") on the surface of the chip and on a surface of each respective island, the TIM comprising an organic matrix comprising nonmetals;
      lidding the chip and the laminate with a lid;
      X-raying the lid, the chip, and the laminate to produce an X-ray; and
      indirectly measuring, using a processor, from the X-ray a bond line thickness ("BLT") of the TIM as a distance from a bottom of the lid to a top surface of the high-density material by using an X-ray contrast between the metal of the high-density material and the nonmetals of the organic matrix.

7. The system of claim 6, wherein the high-density material is a material with sufficiently high mass density as to be detectable by X-rays.

8. The system of claim 6, wherein the high-density material is applied to a plurality of points on the chip.

9. The system method of claim 6, wherein depositing a high-density material comprises cleaning a surface of the chip.

10. The system of claim 9, wherein depositing a high-density material further comprises sputtering a metal seed layer on the surface of the chip.

11. A method, comprising:
    receiving a chip mounted on a laminate;
    cleaning a surface of the chip;
    depositing one or more islands on a surface of the chip, each island comprising a high-density material, the high-density material comprising a metal having a thickness of one to five microns;
    depositing a thermal interface material ("TIM") on the surface of the chip and on a surface of each respective island, the TIM comprising an organic matrix comprising nonmetals;
    lidding the chip and the laminate with a lid;
    X-raying the lid, the chip, and the laminate to produce an X-ray; and
    indirectly measuring from the X-ray a bond line thickness ("BLT") of the TIM as a distance from a bottom of the lid to a top surface of the high-density material by using an X-ray contrast between the metal of the high-density material and the nonmetals of the organic matrix.

12. The method of claim 11, wherein the high-density material is a material with sufficiently high mass density as to be detectable by X-rays.

* * * * *